United States Patent
White

(10) Patent No.: US 6,538,304 B1
(45) Date of Patent: Mar. 25, 2003

(54) CORNER BONDING TO LEAD FRAME

(75) Inventor: Bertram J. White, Irvine, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/715,383

(22) Filed: Nov. 16, 2000

(51) Int. Cl.⁷ .................. H01L 23/48; H01L 27/10; H01L 23/52; H01L 23/06; H02H 1/00

(52) U.S. Cl. .................. 257/666; 257/659; 257/725; 257/691; 257/690; 257/698; 257/696; 257/203; 257/528; 257/355; 257/207; 257/211; 361/126; 361/712; 361/56; 361/91; 174/52.4; 174/261

(58) Field of Search .................. 257/666, 659, 257/725, 696, 698, 691, 690, 203, 528, 355, 43, 207, 211; 361/126, 712, 56, 91, 111, 820, 777; 174/52.4, 261

(56) References Cited

U.S. PATENT DOCUMENTS

| | | | | |
|---|---|---|---|---|
| 67,344 A | * | 6/1867 | Chiu .................. 345/173 |
| 4,514,749 A | * | 4/1985 | Shoji |
| 4,784,033 A | | 11/1988 | Hayden et al. |
| 4,819,047 A | * | 4/1989 | Gilfeather et al. .......... 361/56 |
| 4,839,538 A | | 6/1989 | Curtis |
| 5,173,766 A | * | 12/1992 | Long et al. .............. 257/687 |
| 5,482,897 A | | 1/1996 | Lynch |
| 5,486,720 A | * | 1/1996 | Kierse .................. 257/659 |
| 5,515,226 A | * | 5/1996 | Tailiet .................. 257/355 |
| 5,550,402 A | * | 8/1996 | Nicklaus .................. 257/669 |
| 5,644,167 A | * | 7/1997 | Weiler et al. .............. 257/777 |
| 5,721,439 A | * | 2/1998 | Lin .................. 257/204 |
| 5,796,570 A | * | 8/1998 | Mekdhanasarn et al. .... 361/126 |
| 5,889,308 A | * | 3/1999 | Hong et al. .............. 257/355 |
| 6,008,532 A | * | 12/1999 | Carichner .................. 257/691 |
| 6,043,539 A | * | 3/2000 | Sugasawara .............. 257/357 |
| 6,078,068 A | * | 6/2000 | Tamura .................. 257/203 |
| 6,140,581 A | * | 10/2000 | Cowan et al. .............. 361/212 |
| 6,211,554 B1 | * | 4/2001 | Whitney .................. 257/355 |
| 6,246,113 B1 | * | 6/2001 | Lin .................. 257/692 |
| 6,249,413 B1 | * | 6/2001 | Duvvury .................. 361/111 |

* cited by examiner

*Primary Examiner*—Alexander O. Williams
(74) *Attorney, Agent, or Firm*—W. Daniel Swayze, Jr.; W. James Brady; Frederick J. Telecky, Jr.

(57) ABSTRACT

A lead frame for an integrated circuit includes a ground for the integrated circuit to ground the integrated circuit, the lead frame having at least one corner connected to the ground; and a connector between the corner of the lead frame and the ground located on the integrated circuit.

4 Claims, 2 Drawing Sheets

CORNER BONDING TO LEAD FRAME

FIELD OF THE INVENTION

The present invention relates to the field of integrated circuits and more particularly to integrated circuits having a conductive ground plane overlaying active fine-dimension circuit elements.

BACKGROUND OF THE INVENTION

Integrated circuits have found wide application in contemporary devices requiring electrical circuitry for sensing information storage and retrieval, control, tabulation, operation, monitoring safety improvement information and status display and a variety of other purposes connected with the devices. In fact, many aspects of contemporary devices which previous to the development of such integrated circuits would have been implemented with analog circuitry and also possibly with the use of hard-wired connections, are now easily implemented in very small size and at lightweight and low power consumption with the use of contemporary integrated circuits. The function and features of those integrated circuits makes available in contemporary devices would be very difficult or impossible to implement using the old hard wired circuit construction commonly used in past years. Such old style construction techniques would effectively prohibit the making of many contemporary devices because of cost, size, weight and power consumption consideration.

Further, many of these contemporary integrated circuits are application-specific integrated circuits (ASIC) type, and are designed and manufactured for a specific application or range of related applications. Because of their specialization to prevent a specific task or range of tasks these ASIC-type integrated circuits bring even greater advantages in reduction in size, weight, and power consumption; while improving function, features, and ease of use in comparison to the general-purpose integrated circuits now available. In complex circuits, with many interconnected transistors, a ground plane can eliminate resonances causing signal attenuation or non-linearity which are critical for analog applications and in more general terms, reduce electrical noise. This type of extraneous signal propagation occurs via the substrate.

The second path for extraneous signal propagation occurs between the integrated lines. The use of the ground plane in silicon allows reduction in cross talk or noise generation on adjacent interconnect lines. The electric field radiating from signal lines terminates on the ground plane rather than coupling to an adjacent line. With a complete ground plane, interlock lines with controlled interphases can also be achieved. This becomes increasingly important at the frequencies at which signals propagate increase leading to enhanced sensitivity of the interconnect line to surroundings. Additionally, for good ESD protection it is required to have a wide ground bus around the edge of the chip is required to the ground plane adjacent to all of the external pins. The wide ground bus reduces the on chip voltage between the entrance and exit points of the ESD currents.

SUMMARY OF THE INVENTION

The present invention provides four additional corner pads which are wire bonded to the leadframe. This shunts much of the ESD induced current off the chip and on to the much lower resistance leadframe.

DETAILED DESCRIPTIONS OF THE INVENTION

Figure 1:
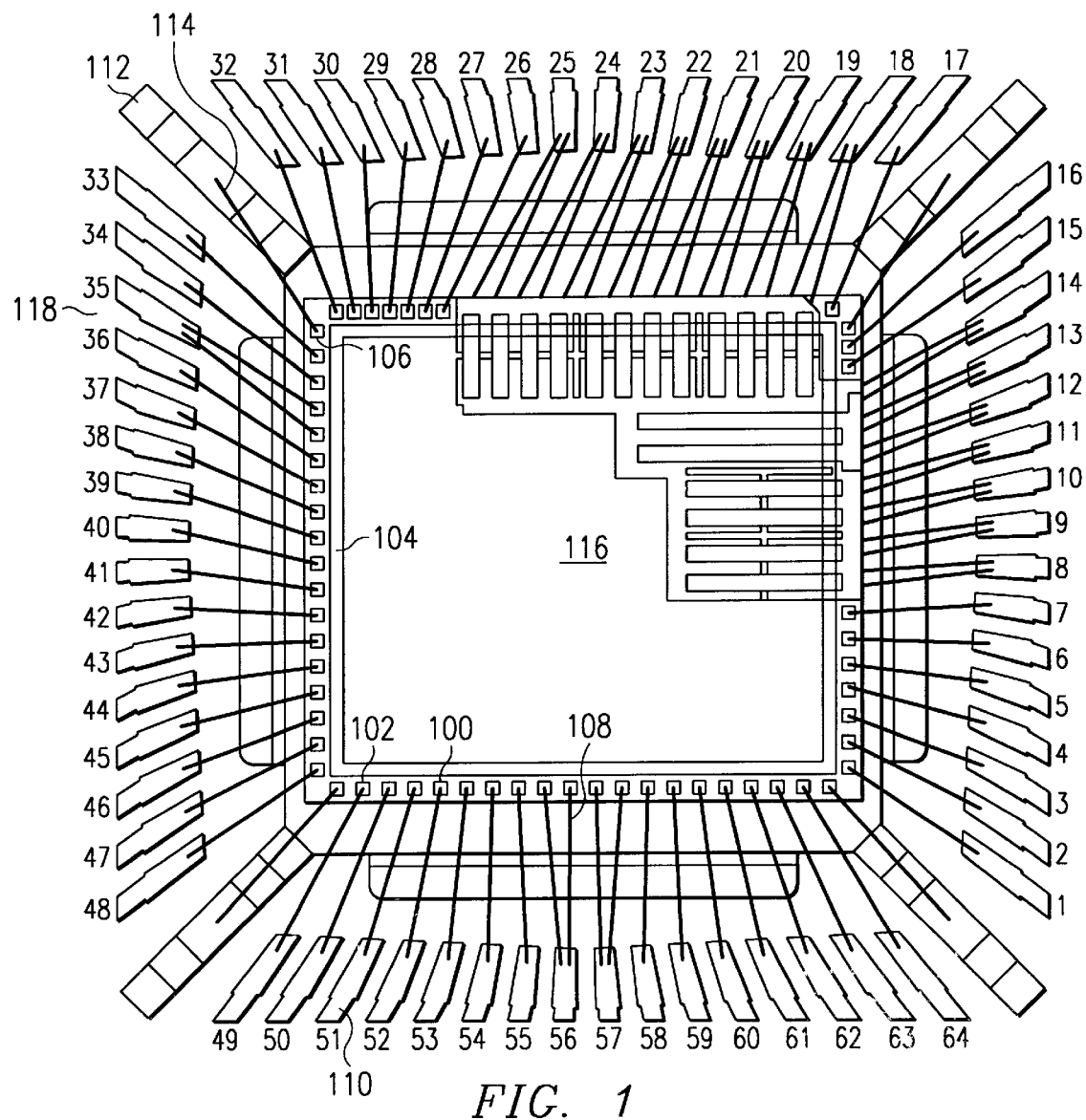
FIG. 1 illustrates connections between the lead frame and die.
Figure 3:
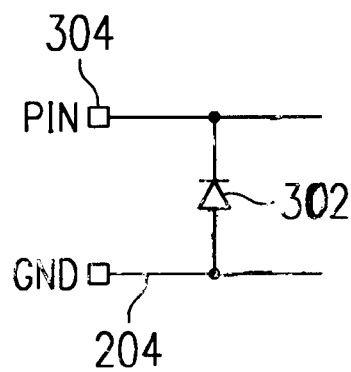
FIG. 3 illustrates a ESD device.

FIG. 1 illustrates a ground plane 104 or ground which is substantially formed around the perimeter of the chip 116 (integrated circuit). Although a rectangular ground plane is shown, other shapes of ground planes could be implemented. More particularly, any side of chip 116 could have a ground plane either singularly with that side, or another side. FIG. 1 shows pin 100 connected to the lead frame 118 by a wire 108. Each connection represented by a pad or pin has an ESD device connected to ground such as illustrated in FIG. 3. The ESD device is represented by an inverter 302 connected between the pin 304 and ground 204. However, other ESD devices could be employed. The ground 204 must be sufficiently wide to carry the current from an electrostatic discharge event. During an electrostatic discharge event, the current must be transferred from the pin 304 or pad to ground 204 by wire 114. As illustrated in FIG. 1, a pad or pin 106 is placed at the corner or near the corner of the chip 116 (an offset) to connect to the corner 112 of lead frame 118. The pin 106 can be placed anywhere in the vicinity of the corner as long as the wire connecting between pin 106 and corner 112 of lead frame 118, wire 114 does not cross other wires. The connection between the pin 106 and lead frame 112 can be made in one or many of the corners of lead frame 118 in order to reduce the resistance to ground since the lead frame 118 is connected to ground. As a consequence, the width of ground bus 104 can be significantly reduced; and more current can flow.

Figure 2:
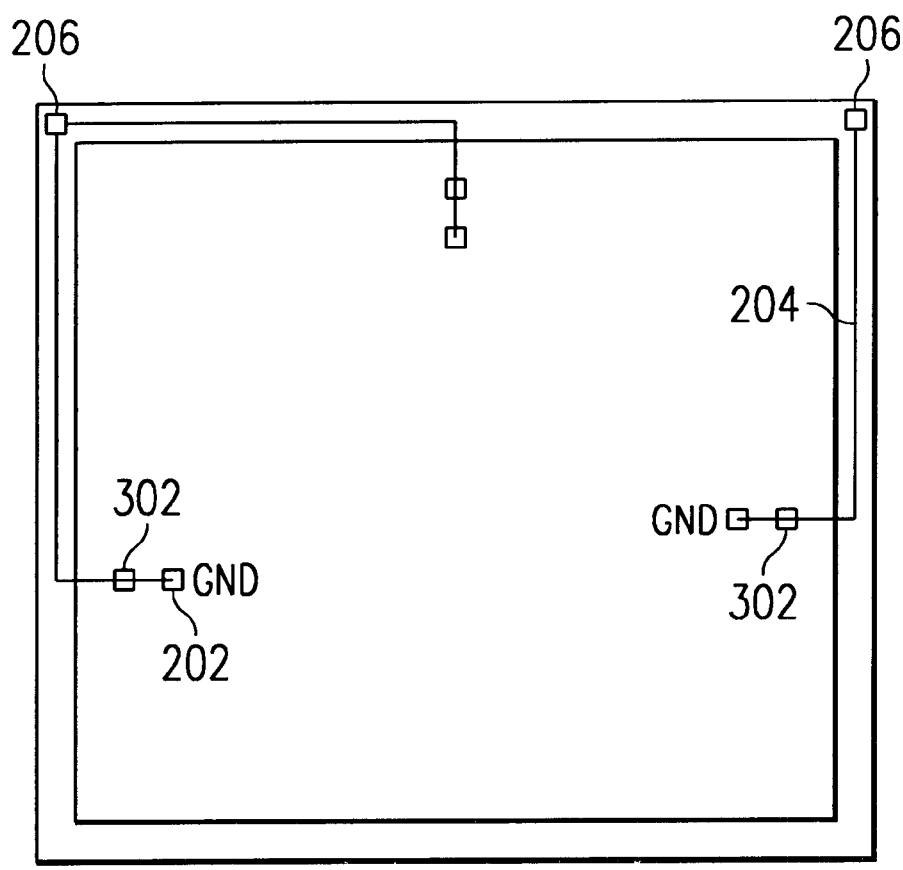
FIG. 2 illustrates the ground plane of the die.

FIG. 2 illustrates pin or pad 202 and pin or pad 204 connected to ground through an electrostatic device (ESD). Additionally, FIG. 2 illustrates the pin or pad connected to the 206 located in the corners connected to the ground bus 204.

The present invention has wide applicability to all types of integrated circuits where ground planes are utilized.

What is claimed is:

1. A lead frame for an integrated circuit, comprising:
   a ground for said integrated circuit to ground said integrated circuit;
   said lead frame having at least one corner connected to said ground; and
   a connector between said corner of said lead frame and said ground located on said integrated circuit.

2. A lead frame for an integrated circuit, as in claim 1, wherein lead frame has a connection in each of four (4) corners of said lead frame.

3. A lead frame for an integrated circuit, as in claim 1, wherein said corner connection is offset with respect to a corner of said integrated circuit.

4. A lead frame for an integrated circuit, as in claim 1, wherein said integrated circuit includes an Electro Static device (ESD) to connect to said ground plane.

* * * * *